United States Patent
Min et al.

(10) Patent No.: US 9,857,400 B2
(45) Date of Patent: Jan. 2, 2018

(54) MOTHERBOARD VOLTAGE TESTING DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Jie Min, Wuhan (CN); Chun-Sheng Chen, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 217 days.

(21) Appl. No.: 14/577,001

(22) Filed: Dec. 19, 2014

(65) Prior Publication Data

US 2016/0146861 A1    May 26, 2016

(30) Foreign Application Priority Data

Nov. 24, 2014 (CN) .......................... 2014 1 0679160

(51) Int. Cl.
| | | |
|---|---|---|
| G01R 15/22 | (2006.01) | |
| G01R 27/28 | (2006.01) | |
| G01R 31/02 | (2006.01) | |
| G01R 19/155 | (2006.01) | |
| G08B 21/00 | (2006.01) | |
| G06F 11/22 | (2006.01) | |

(52) U.S. Cl.
CPC ........ *G01R 19/155* (2013.01); *G06F 11/2284* (2013.01)

(58) Field of Classification Search
CPC ........ G01R 15/22; G01R 27/28; G01R 31/02; G01R 19/00; G01R 19/155; G08B 21/00
USPC ................ 324/96, 72, 76, 537, 615; 714/36; 340/661
See application file for complete search history.

(56) References Cited

U.S. PATENT DOCUMENTS

| | | | |
|---|---|---|---|
| 7,949,886 B2 * | 5/2011 | Zou ........................... | G06F 1/26 713/300 |
| 2011/0032112 A1 * | 2/2011 | Xiong ...................... | G06F 1/28 340/661 |
| 2012/0221282 A1 * | 8/2012 | Chen .................... | G06F 11/2284 702/117 |

* cited by examiner

*Primary Examiner* — Arleen M Vazquez
*Assistant Examiner* — Neel Shah
(74) *Attorney, Agent, or Firm* — ScienBiziP, P.C.

(57) ABSTRACT

Motherboard voltage testing device includes a power supply module for supplying a DC voltage, an illuminating module, and a switching module for detecting a DC voltage of a motherboard. A first terminal of the switching module is coupled to the power supply module, and a second opposite terminal of the switching module is coupled to the illuminating module. When the switching module detects the DC voltage of the motherboard is in the motherboard, the illuminating module is configured to receive the DC voltage of the power supply module to emit light, and when the switching module detects there is no remaining DC voltage on the motherboard, the illuminating module cannot receive the DC voltage from the motherboard and the illuminating module is power off and does not emit light.

8 Claims, 2 Drawing Sheets

MOTHERBOARD VOLTAGE TESTING DEVICE

FIELD

The subject matter herein generally relates to a voltage testing device for detecting a DC voltage of a motherboard.

BACKGROUND

Motherboards need to under go a plurality of tests before leaving the factory. When testing the motherboard, the motherboard can be coupled to a plurality of electronic components to power on, so that the functions of the motherboard can be tested. Usually, when the motherboard is power off, a rest DC voltage can be still be retained which can damage the motherboard.

BRIEF DESCRIPTION OF THE DRAWINGS

Implementations of the present technology will now be described, by way of example only, with reference to the attached figures.

DETAILED DESCRIPTION

Figure 1:
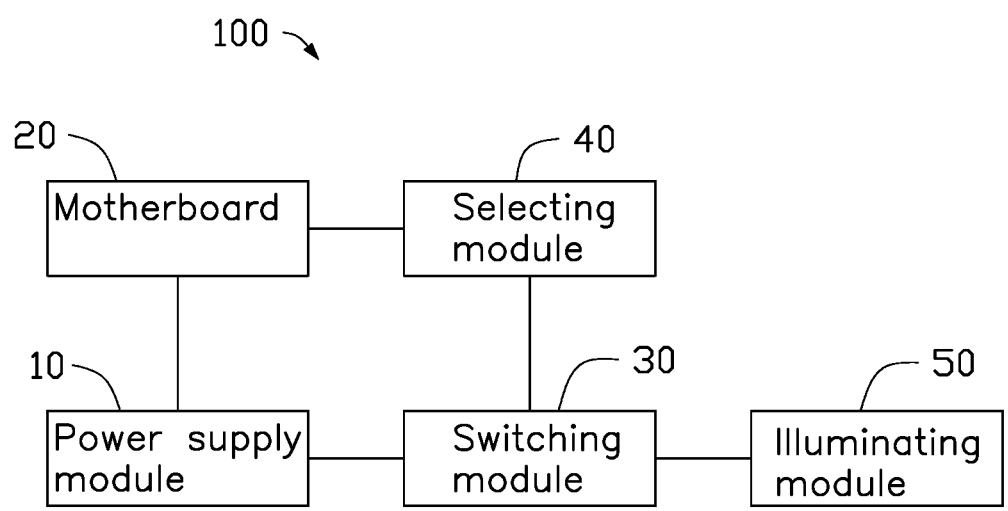
FIG. 1 is a block diagram of an embodiment of a motherboard voltage testing device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a motherboard voltage testing device. The motherboard voltage testing device comprises a power supply module for supplying a DC voltage, an illuminating module, and a switching module for detecting a DC voltage of a motherboard. A first terminal of the switching module is coupled to the power supply module, and a second opposite terminal of the switching module is coupled to the illuminating module. When the switching module detects the DC voltage of the motherboard, the illuminating module is configured to receive the DC voltage from the power supply module to emit light, and when the switching module detects there is no remaining DC voltage in the motherboard, the illuminating module cannot receive the DC voltage from the motherboard and the illuminating module is power off and does not emit light.

FIG. 1 illustrates an embodiment of the motherboard voltage testing device 100 used to detect a voltage of a motherboard 20. The motherboard voltage testing device 100 comprises a power supply module 10, a switching module 30, a selecting module 40 coupled to the switching module 30, and an illuminating module 50. The power supply module 10 is coupled to a first terminal of the switching module 10, and the illuminating module 50 is coupled to a second opposite terminal of the switching module 10. In at least one embodiment, the illuminating module 50 is a light emitting diode.

Figure 2:
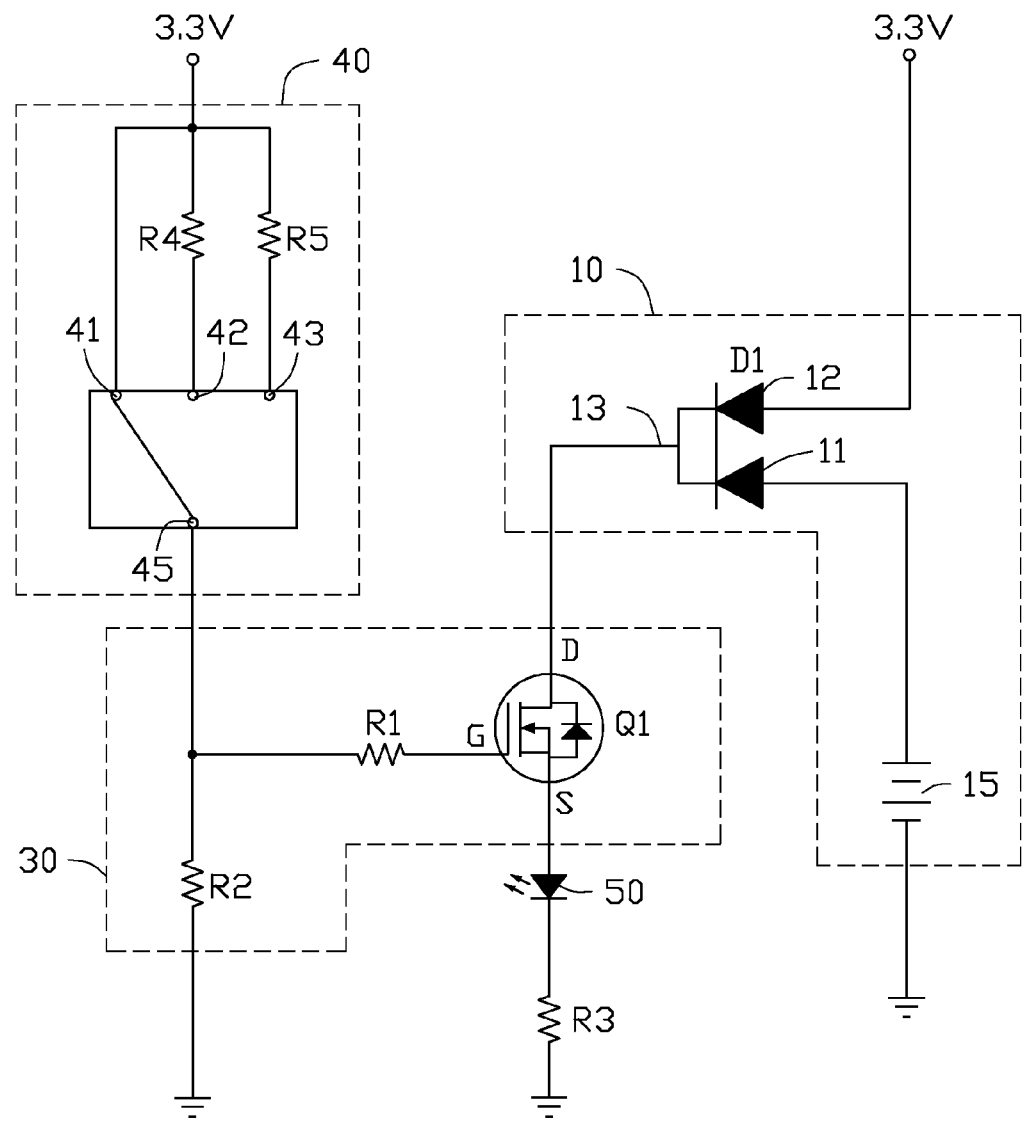
FIG. 2 is a circuit diagram of an embodiment of the motherboard voltage testing device of FIG. 1.

FIG. 2 illustrates the circuit diagram of the motherboard voltage testing device 100. The power supply module 10 can comprise a Schottky diode D1. A first input terminal of the Schottky diode D1 is coupled to a battery 15, a second input terminal of the Schottky diode D1 is coupled to a power supply (not shown) of the motherboard 20 by a first plug (not shown) for receiving a DC voltage from the motherboard 20. The battery 15 is grounded by a second plug. In at least one embodiment, the battery 15 can supply a 3V DC voltage, a first DC voltage input to the first input terminal 11 of the power supply module 10 is less than a second DC voltage input to the second input terminal 12 of the power supply module 10, such as, the first DC voltage can be 3V DC voltage supplied by the battery 15, and the second DC voltage can be 3.3V DC voltage, or 5V DC voltage, or 12V DC voltage supplied by the motherboard 20. An output terminal 13 of the Schottky diode D1 is coupled to the switching module 30.

The switching module 30 is used to detect the DC voltage of the motherboard 20, and when a DC voltage is detected by the switching module 30, the illuminating module 50 can receive a DC voltage from the power supply module 10 to light. The switching module 30 can comprises a Field Effect Transistor (FET) Q1, a first resistor R1 and a second resistor R2. A drain electrode D of the FET Q1 is coupled to the output terminal 13 of the power supply module 10, a source electrode S of the FET Q1 is coupled to the illuminating module 50, and the illuminating module 50 is grounded. A grid electrode G of the FET Q1 is coupled to a first terminal of the first resistor R1, and a second opposite terminal of the first resistor R2 is grounded by the second resistor R2.

Because the first DC voltage input to the first input terminal 11 of the power supply module 10 is less than the second DC voltage input to the second input terminal 12 of the power supply module 10, when the FET Q1 is switched on and the power supply module 10 receives the first DC voltage via the first input terminal 11 and the second DC voltage via the second input terminal 12, the illuminating module 50 receives the second DC voltage from the power supply module 10 to light. When the FET Q1 is switched on and the power supply module 10 only receives the first DC voltage via the first input terminal 11, the illuminating module 50 receives the first DC voltage from the power supply module 10 to light.

The selecting module 40 is used to couple to the motherboard 20 and can comprise a first input terminal 41, a second input terminal 42, a third input terminal 43, and an output terminal 45 which can be selected to couple to one of the first input terminal 41, the second input terminal 42 and the third input terminal 43. The first input terminal 41 is coupled to a fourth resistor R4, the second input terminal 42 is coupled to a fifth resistor R5. The selecting module 40 can be coupled to the motherboard 20 via a third plug (not shown) for receiving the DC voltage from the motherboard 20. The output terminal 45 is coupled to the first resistor R1 and the second resistor R2 via a node. When the grid electrode G of the FET Q1 is received the DC voltage of the motherboard 20 via the output terminal 45, the FET Q1 is switched on, and the illuminating module 50 receives the DC voltage from the power supply module 10 to light. When the DC voltage of the motherboard 20 is drained, the FET Q1 is switched off, and the illuminating module 50 goes out because the illuminating module 50 cannot receive the DC voltage from the power supply module 10. In at least one embodiment, the selecting module 40 is a single-pole triple-throw switch.

In use, a final dropped DC voltage of the motherboard 20 can be detected by an oscilloscope, such as a 3.3V DC voltage. Then, the first input terminal 41 is coupled to the output terminal 45, and the selecting module 40 is coupled to the motherboard 20. The motherboard 20 is powered on, and the DC voltage output by the output terminal 45 is 3.3V, the grid electrode G of the FET Q1 receives the 3.3V DC voltage for allowing the FET Q1 to switch on. The first input terminal 11 of the power supply module 10 receives the 3V DC voltage of the battery 15, the second input terminal 12 of the power supply module 10 receives the 3.3V DC voltage from the motherboard 20, and the illuminating module 50 receives the 3.3V DC voltage from the motherboard 20 to light. The motherboard 20 is powered off, a remaining DC voltage can remain in the motherboard 20, and the FET Q1 can still be switched on. The 3.3V DC voltage input to the second input terminal 12 is dropped, and the illuminating module 50 can receive the 3V DC voltage from the battery 15 to light for warning the user not to operate the motherboard 20. When the remaining DC voltage on the motherboard 20 is dropped, the grid electrode G of the FET Q1 cannot receive the DC voltage, and the EFT Q1 is switched off. The illuminating module 50 cannot receive the DC voltage and the illuminating module 50 is powered off and does not emit light for informing the user to operate the motherboard 20.

The embodiments shown and described above are only examples. Many details are often found in the art such as the other features of a motherboard. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A motherboard voltage testing device comprising:
   a power supply module configured to supply a DC voltage;
   an illuminating module;
   a switching module configured to detect a DC voltage of a motherboard; a first terminal of the switching module coupled to the power supply module, and a second opposite terminal of the switching module coupled to the illuminating module; and
   a selecting module configured to select the DC voltage of the motherboard to the switching module;
   wherein when the switching module detects the DC voltage of the motherboard present, the illuminating module is configured to receive the DC voltage of the power supply module to emit light, and when the switching module detects there is no DC voltage present on the motherboard, the illuminating module cannot receive the DC voltage from the power supply module and the illuminating module is power off and does not emit light;
   wherein the switching module comprises a Field Effect Transistor (FET), a drain electrode of the FET is coupled to the power supply module, a source electrode of the FET is coupled to the illuminating module, and a grid electrode of the FET is coupled to the motherboard via a first resistor.

2. The motherboard voltage testing device of claim 1, wherein a first terminal of the first resistor is coupled to the grid electrode of the FET, and a second opposite terminal of the first resistor is grounded via a second resistor.

3. The motherboard voltage testing device of claim 1, wherein the selecting module is coupled to the first resistor via a node.

4. The motherboard voltage testing device of claim 3, wherein the selecting module is a single-pole triple-throw switch which is coupled to the motherboard, and the single-pole triple-throw switch is configured to input the DC voltage of the motherboard to the grid electrode of the FET.

5. A motherboard voltage testing device comprising:
   a power supply module configured to supply a first DC voltage and a second DC voltage;
   an illuminating module;
   a switching module configured to detect a DC voltage of a motherboard; a first terminal of the switching module coupled to the power supply module, and a second opposite terminal of the switching module coupled to the illuminating module; and
   a selecting module configured to select the DC voltage of the motherboard to the switching module;
   wherein when the switching module detects the DC voltage of the motherboard present, the illuminating module is configured to receive the first DC voltage or the second DC voltage to emit light, and when the switching module detects there is no DC voltage present on the motherboard, the illuminating module cannot receive the first DC voltage or the second DC voltage and the illuminating module is power off and does not emit light;
   wherein the switching module comprises a Field Effect Transistor (FET), a drain electrode of the FET is coupled to the power supply module, a source electrode of the FET is coupled to the illuminating module, and a grid electrode of the FET is coupled to the motherboard via a first resistor.

6. The motherboard voltage testing device of claim 5, wherein a first terminal of the first resistor is coupled to the grid electrode of the FET, and a second opposite terminal of the first resistor is grounded via a second resistor.

7. The motherboard voltage testing device of claim 5, wherein the selecting module is coupled to the first resistor via a node.

8. The motherboard voltage testing device of claim 7, wherein the selecting module is a single-pole triple-throw switch which is coupled to the motherboard, and the single-pole triple-throw switch is configured to input the DC voltage of the motherboard to the grid electrode of the FET.

* * * * *